US009772370B2

(12) United States Patent
Murashima et al.

(10) Patent No.: US 9,772,370 B2
(45) Date of Patent: Sep. 26, 2017

(54) PHYSICAL QUANTITY DETECTING SENSOR, ELECTRONIC APPARATUS, MOVING OBJECT, AND ELECTRONIC CIRCUIT

(71) Applicant: Seiko Epson Corporation, Tokyo (JP)

(72) Inventors: Noriyuki Murashima, Chino (JP); Takemi Yonezawa, Minowa (JP)

(73) Assignee: Seiko Epson Corporation (JP)

( * ) Notice: Subject to any disclaimer, the term of this patent is extended or adjusted under 35 U.S.C. 154(b) by 300 days.

(21) Appl. No.: 14/666,870

(22) Filed: Mar. 24, 2015

(65) Prior Publication Data
US 2015/0276853 A1   Oct. 1, 2015

(30) Foreign Application Priority Data

Mar. 25, 2014   (JP) .................................. 2014-062506

(51) Int. Cl.
G01R 31/28 (2006.01)
G05F 1/10 (2006.01)
G01P 15/125 (2006.01)
G01P 21/00 (2006.01)
G01P 15/08 (2006.01)

(52) U.S. Cl.
CPC ............ *G01R 31/28* (2013.01); *G01P 15/125* (2013.01); *G01P 21/00* (2013.01); *G05F 1/10* (2013.01); *G01P 2015/0814* (2013.01); *Y10T 307/664* (2015.04)

(58) Field of Classification Search
CPC ....... G01R 31/28; G01P 15/125; G01P 21/00; G01P 2015/0814; G05F 1/10; Y10T 307/664
See application file for complete search history.

(56) References Cited

U.S. PATENT DOCUMENTS

| 8,710,914 B1* | 4/2014 | Guhados ................... G05F 1/10 327/540 |
| 2006/0235630 A1 | 10/2006 | Ito et al. |
| 2012/0030419 A1* | 2/2012 | Chino .................... G01D 3/022 711/106 |
| 2013/0185012 A1* | 7/2013 | Yamamoto ............... G01D 3/02 702/104 |

FOREIGN PATENT DOCUMENTS

| JP | 2011-120058 A | 6/2011 |
| JP | 2011-151824 A | 8/2011 |
| JP | 2012-108585 A | 6/2012 |

* cited by examiner

*Primary Examiner* — Patrick Assouad
*Assistant Examiner* — Haidong Zhang
(74) *Attorney, Agent, or Firm* — Harness, Dickey & Pierce, P.L.C.

(57) ABSTRACT

A physical quantity detecting sensor includes a physical quantity detecting sensor element and an IC connected to the physical quantity detecting sensor element. The IC includes: a logic circuit; an analog circuit; a first regulator that supplies a logic power supply voltage generated based on a power supply voltage to the logic circuit; a second regulator that is switched to enable or disable and supplies an analog power supply voltage, which is generated based on the power supply voltage when the second regulator is set to enable, to the analog circuit; and a switch for supplying the logic power supply voltage to the analog circuit when the second regulator is set to disable.

18 Claims, 15 Drawing Sheets

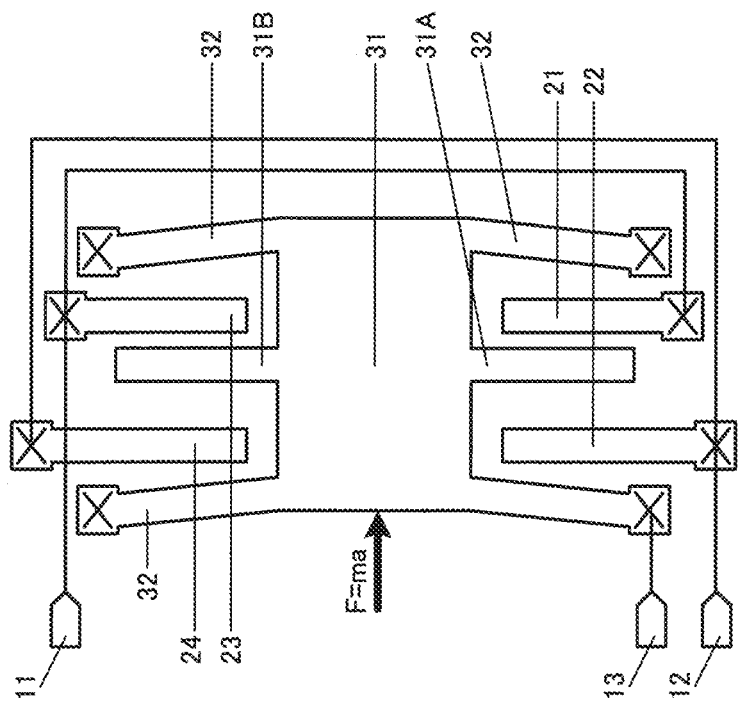
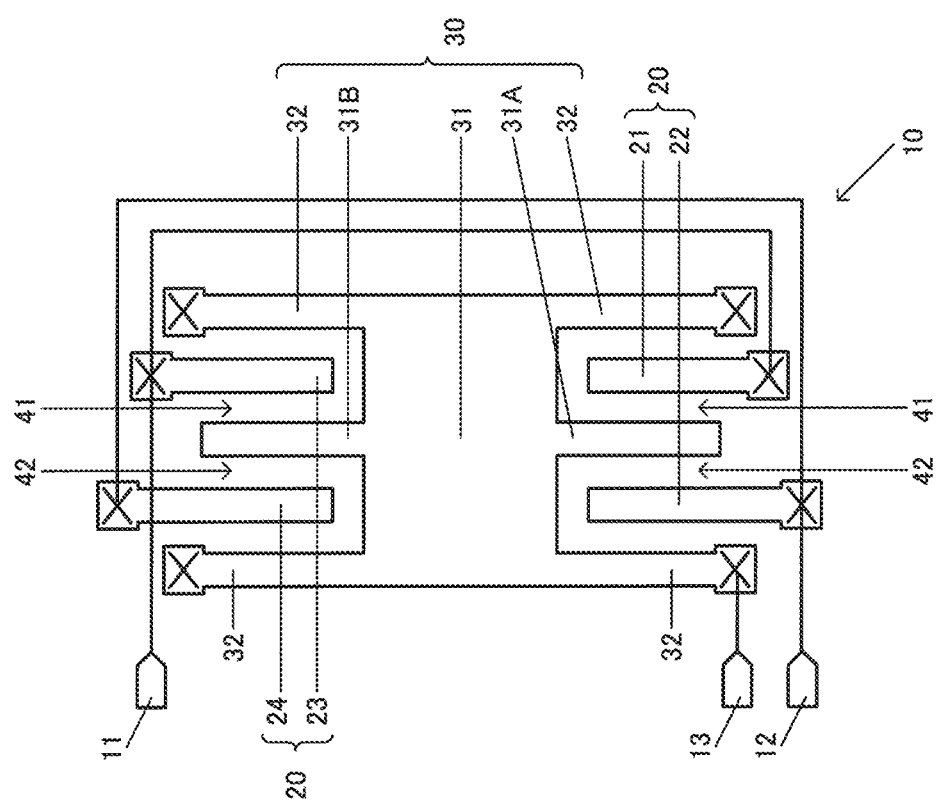

PHYSICAL QUANTITY DETECTING SENSOR, ELECTRONIC APPARATUS, MOVING OBJECT, AND ELECTRONIC CIRCUIT

BACKGROUND

1. Technical Field

The present invention relates to a physical quantity detecting sensor, an electronic apparatus, a moving object, an electronic circuit, and the like.

2. Related Art

In a device disclosed in JP-A-2011-151824 (Abstract and [0040]), a power switch SW for connection between an internal power supply Vint0 that is not turned off and an internal power supply Vint1 that can be turned off is provided.

In a device disclosed in JP-A-2011-120058, a first regulator for supplying a first supply voltage to a first logic circuit and a second regulator for supplying a second supply voltage to a second logic circuit are provided. The second regulator is turned off in a low power consumption mode.

In a device disclosed in JP-A-2012-108585, a main regulator and a sub-regulator for sleep are provided. The main regulator is turned off in the sleep state.

The switch SW disclosed in JP-A-2011-151824 (Abstract and [0040]) is turned off when the internal power supply Vint1 is turned off. The reason why the switch SW is provided in the device disclosed in JP-A-2011-151824 (Abstract and [0040]) is to make the internal power supplies Vint0 and Vint1 have the same electric potential accurately.

In a device disclosed in JP-A-2011-120058, electric power for operating the BGR is required even in a standby state. In the device disclosed in JP-A-2012-108585, the power supply is limited only to the logic power supply.

SUMMARY

An advantage of some aspects of the invention is to provide a physical quantity detecting sensor, an electronic apparatus, a moving object, and an electronic circuit capable of shortening the time for returning an analog circuit to the enable state while reducing power consumption by disabling the analog circuit and an analog power supply circuit.

The invention can be implemented as the following forms or application examples.

(1) An aspect of the invention relates to a physical quantity detecting sensor including: a physical quantity detecting sensor element; and an IC connected to the physical quantity detecting sensor element. The IC includes: a logic circuit; an analog circuit; a first regulator that supplies a logic power supply voltage generated based on a power supply voltage to the logic circuit; a second regulator that is switched to enable or disable and supplies an analog power supply voltage, which is generated based on the power supply voltage when the second regulator is set to enable, to the analog circuit; and a switch for supplying the logic power supply voltage to the analog circuit when the second regulator is set to disable.

According to the aspect of the invention, by operating the analog circuit when detecting the physical quantity, it is possible to reduce power consumption in an idle period in which the analog circuit is disabled. A voltage is also required to return the analog circuit in a disable state to an enable state. In this case, it takes time to supply the analog power supply voltage to the analog circuit by enabling the second regulator. In the physical quantity sensor according to the aspect of the invention, during the idle period of the analog circuit, the logic power supply voltage from the first regulator is supplied to the analog circuit through the switch. Therefore, it is possible to shorten the operation for returning to the enable state.

(2) In the aspect of the invention, the switch may be switched to ON or OFF by a signal for setting the second regulator to disable.

Since there is a correlation between ON or OFF of the switch and disable or enable of the analog circuit, the ON or OFF switching signal of the switch can be generated based on the disable signal for setting the second regulator to disable.

(3) In the aspect of the invention, a voltage level of the logic power supply voltage and a voltage level of the analog power supply voltage may be substantially the same.

This is because, if there is a difference between the voltage level of the logic power supply voltage and the voltage level of the analog power supply voltage, a voltage drop or ringing tends to occur at the time of return operation. However, as long as the analog circuit performs a return operation normally, the voltage level of the logic power supply voltage and the voltage level of the analog power supply voltage may be different.

(4) In the aspect of the invention, when testing the IC, the first regulator may generate a test voltage higher than the logic power supply voltage and supply the test voltage to the analog circuit through the switch.

The first regulator can generate a test voltage causing overload by changing the output voltage level of the first regulator to a high voltage level through a register setting change or the like, for example, by changing the resistance value of a variable resistor.

(5) In the aspect of the invention, the physical quantity detecting sensor element may be a capacitive sensor element, the analog circuit may include a charge-voltage conversion circuit that converts an electric charge from the capacitive sensor element into a voltage, and the charge-voltage conversion circuit may be set to disable when the second regulator is set to disable.

When the second regulator is disabled, the charge-voltage conversion circuit is disabled to reduce power consumption. In addition, the logic power supply voltage from the first regulator is supplied to the charge-voltage conversion circuit, which is an analog circuit, through the switch. Therefore, it is possible to shorten the operation for returning to the enable state.

(6) In the aspect of the invention, the analog circuit may further include a programmable gain amplifier that amplifies an output signal from the charge-voltage conversion circuit with a set gain, and the programmable gain amplifier may be set to disable when the second regulator is set to disable.

When the second regulator is disabled, the programmable amplifier is disabled to reduce power consumption. In addition, the logic power supply voltage from the first regulator is supplied to the programmable amplifier, which is an analog circuit, through the switch. Therefore, it is possible to shorten the operation for returning to the enable state.

(7) In the aspect of the invention, the analog circuit may further include an analog-to-digital converter that performs analog-to-digital conversion of an output signal from the programmable gain amplifier, and the analog-to-digital converter may be set to disable when the second regulator is set to disable.

When the second regulator is disabled, the analog-to-digital converter is disabled to reduce power consumption. In addition, the logic power supply voltage from the first regulator is supplied to the analog-to-digital converter, which is an analog circuit, through the switch. Therefore, it is possible to shorten the operation for returning to the enable state.

(8) In the aspect of the invention, a processing period in which the analog circuit processes a signal from the physical quantity detecting sensor based on an external trigger may be set, the second regulator may be set to enable within the processing period, and the analog circuit may be set to disable in a period other than the processing period. At least one of the programmable gain amplifier and the analog-to-digital converter may be set to disable in an idle period set within the processing period.

Since the analog circuit is disabled in a period other than the processing period and the programmable gain amplifier or the analog-to-digital converter is also disabled in an idle period within the processing period, it is possible to reduce power consumption. In addition, even if the second regulator is disabled while the analog circuit is in a disable state, the logic power supply voltage from the first regulator is supplied to the analog circuit through the switch. Therefore, it is possible to shorten the operation for returning to the enable state.

(9) In the aspect of the invention, the first regulator may include a differential amplifier circuit having an offset voltage due to a work function difference voltage between a non-inverting input terminal and an inverting input terminal, first and second resistors provided in series between an output node of the amplifier circuit and a first power supply node, and a phase compensation capacitor having an end connected to a connection node between the first and second resistors. A signal of the connection node may be fed back to the non-inverting input terminal of the amplifier circuit, and a signal of the output node may be fed back to the inverting input terminal of the amplifier circuit.

According to the first regulator, a constant voltage determined by the offset voltage between the non-inverting input terminal and the inverting input terminal of the amplifier circuit and the resistance ratio between the first and second resistors is generated. The phase compensation capacitor is provided at the connection node between the first and second resistors, and the signal of this connection node is fed back to the non-inverting input terminal of the amplifier circuit and the signal of the output node of the amplifier circuit is fed back to the inverting input terminal of the amplifier circuit. Thus, it is possible to construct the first regulator capable of generating a constant voltage with a stable circuit operation.

(10) In the aspect of the invention, the first regulator may further include a current source, which generates a current when activating the first regulator and at the time of overload when the second regulator is in an enabled state, and a current mirror circuit that makes a current equal to the current flowing through the current source flow through the first regulator.

In this case, through the operation of the current mirror circuit, it is possible to increase the capability especially when activating the first regulator, which requires a large load, and at the time of overload when the second regulator is in an enable state.

(11) In the aspect of the invention, the second regulator may include a band gap reference circuit, an amplifier that amplifies a band gap reference voltage from the band gap reference circuit, and a voltage divider circuit provided in a negative feedback path of the amplifier. The amplifier may perform negative feedback control so that a voltage of the voltage divider circuit and an electric potential of the band gap reference voltage match each other with the band gap reference voltage as a reference voltage.

By amplifying the band gap reference voltage as described above, it is possible to generate the analog power supply voltage.

(12) Another aspect of the invention relates to an electronic apparatus including the physical quantity detecting sensor described above.

(13) Still another aspect of the invention relates to a moving object including the physical quantity detecting sensor described above.

(14) Still another aspect of the invention relates to an electronic circuit connected to a physical quantity detecting sensor element, in which the electronic circuit includes the configuration of the IC described above.

BRIEF DESCRIPTION OF THE DRAWINGS

The invention will be described with reference to the accompanying drawings, wherein like numbers reference like elements.

FIGS. 2A and 2B are diagrams showing a differential capacitive sensor element that is an example of an acceleration sensor element.

DESCRIPTION OF EXEMPLARY EMBODIMENTS

Hereinafter, an embodiment of the invention will be described with reference to the accompanying diagrams. In addition, the present embodiment to be described below does not unduly limit the contents of the invention as defined in the appended claims, and all constituent elements described in the present embodiment are not necessarily indispensable as solving means of the invention.

1. Acceleration Sensor (Physical Quantity Detecting Sensor)

Figure 1:
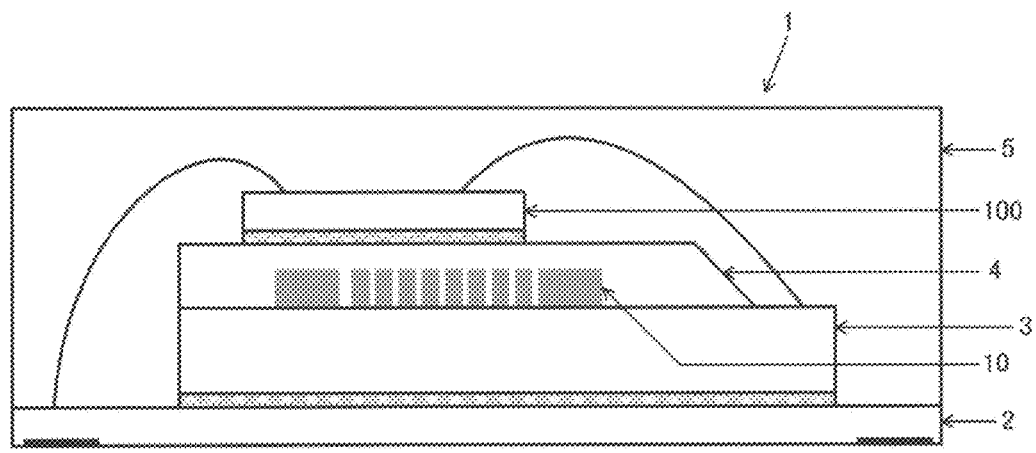
FIG. 1 is a diagram showing an acceleration sensor that is an example of a physical quantity detecting sensor according to an embodiment of the invention.

FIG. 1 shows an acceleration sensor that is an example of a physical quantity detecting sensor according to an embodiment of the invention. For example, an acceleration sensor 1 includes an interposer substrate 2, a glass substrate 3 formed on the interposer substrate 2, an acceleration sensor element 10 that is formed on the glass substrate 3 by micro electro mechanical systems (MEMS) using a semiconductor material, such as silicon (Si), a MEMS cap 4, and an integrated circuit (IC) 100 that is an acceleration detection circuit (electronic circuit) formed on the MEMS cap 4. The IC 100 is connected to an electrode portion formed on the interposer substrate 2 and the glass substrate 3, for example, by wire bonding. The components 3, 10, 4, and 100 mounted on the interposer substrate 2 are sealed by a mold 5.

2. Acceleration Sensor Element

FIG. 2A is a diagram illustrating the structure of, for example, a differential capacitive sensor element that is used as the acceleration sensor element 10 shown in FIG. 1. The differential capacitive acceleration sensor element 10 includes a fixed portion 20 and a movable portion 30. The fixed portion 20 is a member fixed to a substrate (not shown). The movable portion 30 is an example of the structure that is displaced according to acceleration, and includes a weight portion 31 and a spring portion 32. One end of the spring portion 32 is fixed to the substrate, and the other end is connected to the weight portion 31. The weight portion 31 is supported by the spring portion 32. When acceleration a is applied to the differential capacitive acceleration sensor element 10 as shown in FIG. 2B, a force of F=ma is applied to the weight portion 31 having a mass m. The spring portion 32 is deformed by the force, and the weight portion 31 is relatively displaced with respect to the fixed portion 20.

The weight portion 31 includes a movable electrode 31A and a movable electrode 31B. The fixed portion 20 includes fixed electrodes 21 to 24. The movable electrode 31A is disposed between the fixed electrodes 21 and 22, and the movable electrode 31B is disposed between the fixed electrodes 23 and 24. The differential capacitive acceleration sensor element 10 is formed of a semiconductor material, such as silicon (Si), through micro electro mechanical systems (MEMS) using semiconductor processing technology, for example.

Here, the pair which is the movable electrode 31A and the fixed electrode 21 and the pair which is the movable electrode 31B and the fixed electrode 23 are referred to as a first capacitor forming portion 41. Similarly, the pair which is the movable electrode 31A and the fixed electrode 22 and the pair which is the movable electrode 31B and the fixed electrode 24 are referred to as a second capacitor forming portion 42. The differential capacitive acceleration sensor element 10 includes one end 11 of the first capacitor forming portion 41, one end 12 of the second capacitor forming portion 42, and a common terminal 13 of the first and second capacitor forming portions 41 and 42. When the acceleration a shown in FIG. 1A is applied, the capacitance value of the first capacitor forming portion 41 is decreased, but the capacitance value of the second capacitor forming portion 42 is increased. Therefore, when the acceleration a is applied to the weight portion 31 in a state where electric charges are supplied to the common terminal 13, electric charges (signals) output from the ends 11 and 12 of the first and second capacitor forming portions 41 and 42 become a differential signal pair of the same absolute value and opposite signs.

3. Circuit Diagram of the Acceleration Sensor

An example of detecting the acceleration in one axial direction in which the acceleration a is applied has been described with reference to FIG. 2B. In the acceleration sensor 1 shown in FIG. 3, first to third differential capacitive acceleration sensor elements 10X, 10Y, and 10Z are provided with N (N is an integer of 2 or more) axes as detection axes, for example, with X, Y, and Z axes, which are three axes perpendicular to each other (in a broad sense, N axes crossing each other) when N is 3, as respective detection axes.

Each of the first to third differential capacitive acceleration sensor elements 10X, 10Y, and 10Z includes the first and second capacitor forming portions 41 and 42 shown in FIG. 1A, and there is an offset, which is different for each axis, between fixed capacitors of the first and second capacitor forming portions 41 and 42. If acceleration is detected in a state where there is an offset, a value when acceleration is present is output even if no acceleration is applied. Therefore, offset adjustment (calibration) is required.

An offset adjustment capacitor 120 that is a variable capacitor is provided in the IC 100. The offset adjustment capacitor 120 is reset, for each axis, to a capacitance value based on the offset amount between the fixed capacitors of the first capacitor forming portion 41 and the second capacitor forming portion 42.

Electric charges are input to the IC 100 from the first to third differential capacitive acceleration sensor elements 10X, 10Y, and 10Z in a time-division manner. For the time-division driving, a multiplexer (MUX) 110 that is switching-driven is provided.

In a stage subsequent to the multiplexer 110, for example, a charge-voltage conversion (QV) amplifier 131, a programmable gain amplifier (PGA) 132, and an analog-to-digital converter (ADC) 133 are provided as a capacitance detection circuit (in a broad sense, a signal processing section) 130 that is an analog circuit. The QV amplifier 131 converts electric charges from the capacitive acceleration sensor elements 10X, 10Y, and 10Z, which are input in a time-division manner, into a voltage. Since outputs from the capacitive acceleration sensor elements 10X, 10Y, and 10Z are differential signals, the QV amplifier 131 functions as a differential amplifier circuit. The PGA 132 amplifies the output of the QV amplifier 131 with a gain set for each axis. The ADC 133 performs analog-to-digital conversion of the output of the PGA 132.

A digital filter 140, a register 150, and a serial-parallel interface circuit (SPI) 160 are provided in a stage subsequent to the ADC 23. An acceleration signal based on the capacitance detected by the capacitance detection circuit 130 is output through the SPI 160.

In addition, a temperature sensor 190 can be provided in the IC 100. A temperature signal from the temperature sensor 190 is amplified by the PGA 132 and is then converted into a digital signal by the ADC 133.

The IC 100 includes a control circuit 170. An oscillation circuit (OSC) 181, a nonvolatile memory 182 such as a floating gate type avalanche injection MOS (FAMOS), a power-on reset circuit 183, a level shifter 184, a test circuit 185, a driving circuit 186, the digital filter 140 and the register 150 described above, and the like are connected to the control circuit 170. Data for setting the offset capacitance value measured in advance is input from the outside through the SPI 160, and is stored in the nonvolatile memory 182 by the control circuit 170. When activating the acceleration sensor 1, data for offset capacitance value setting that is read from the nonvolatile memory 182 by the control circuit 170 is stored in the register 150. For example, by setting a voltage in the voltage control type offset adjustment capacitor 120 based on the set data, the register 150 can set the offset adjustment capacitor 120 to have an offset capacitance value for each axis.

Power supply voltages VDD and GND are input to the IC 100 from the outside. A first regulator REG1 that generates a logic power supply voltage VDDD (for example, 1.8 V) by stepping down a power supply voltage VDD (for example, 3 V) and a second regulator REG2 that generates an analog power supply voltage VDDA (for example, 1.8 V) by stepping down the power supply voltage VDD are provided in the IC 100. The first regulator REG1 is a logic power supply circuit that is enabled by the activation of the acceleration sensor 1 and generates the logic power supply voltage VDDD while the acceleration sensor 1 is operating (including a standby period, an idle period, and the like). On the other hand, the second regulator REG2 is an analog power supply circuit switched to enable or disable, and generates the analog power supply voltage VDDA only in the enable period.

The IC 100 can have not only power supply terminals VDD, VPP, VDDIO, and GND, input/output terminals SCL/SPC, SDA/SDI, SDO/SAO, and CS, and a test terminal TES1-3 but also interruption terminals INT1 and INT2.

4. Power Supply Circuit System of an IC

Figure 3:
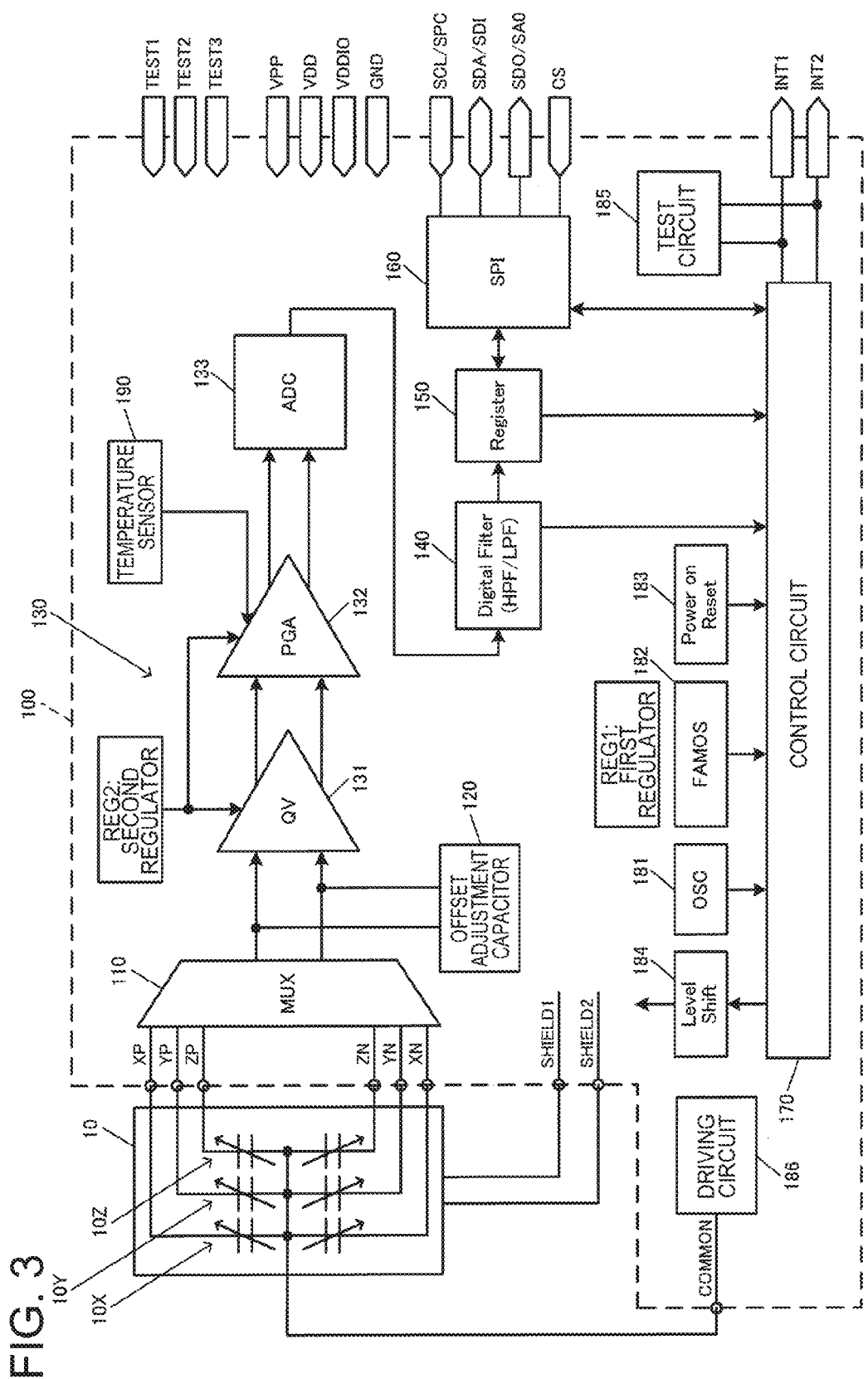
FIG. 3 is a block diagram of an acceleration sensor.
Figure 4:
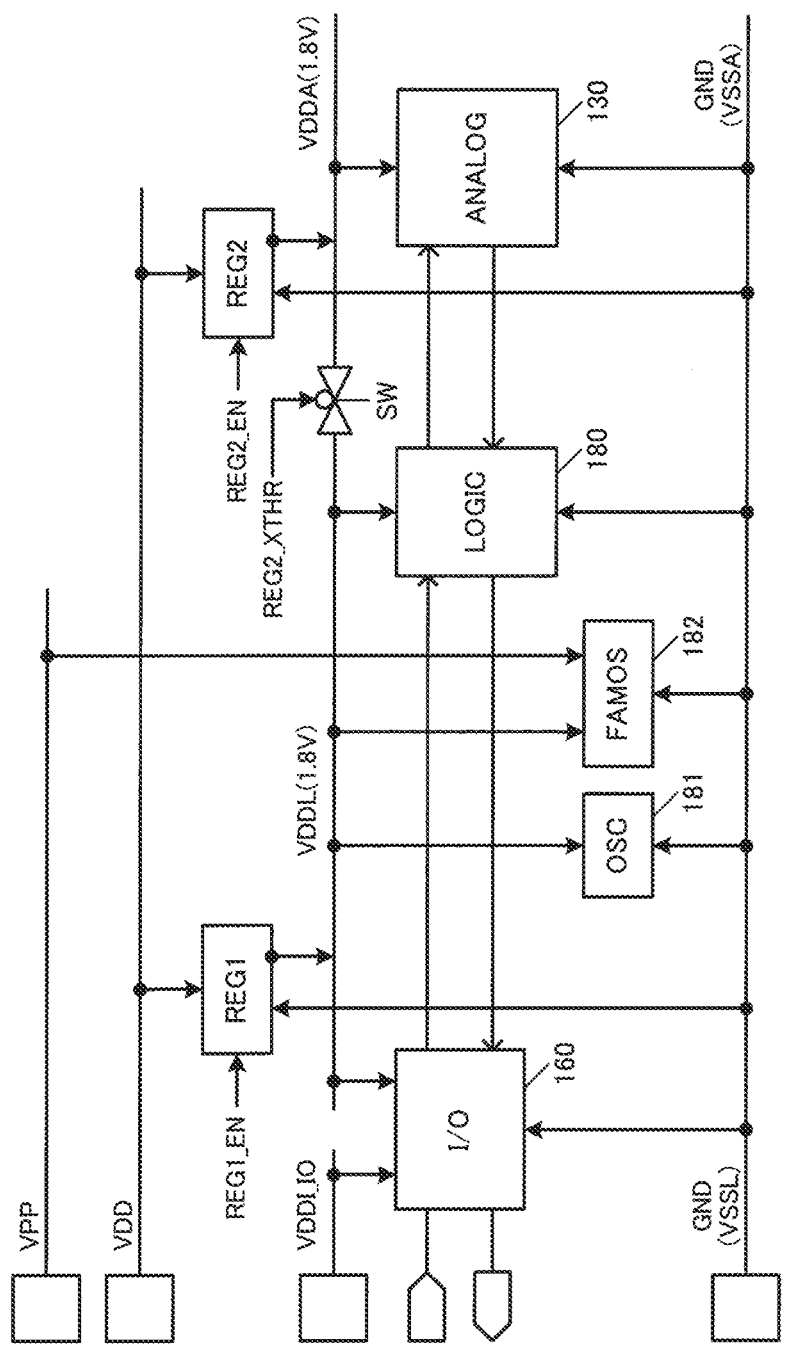
FIG. 4 is a block diagram of the power supply system of an IC.

FIG. 4 is a block diagram showing a power supply circuit system of the IC 100 shown in FIG. 3. In FIG. 4, a circuit driven by the digital power supply voltage, which is a voltage supply target, is referred to collectively as a logic circuit 180. In addition, the OSC 181 and the nonvolatile memory (FAMOS) 182 are shown as other circuits.

In FIG. 4, the first regulator REG1 that is enabled by an enable signal REG1_EN supplies a logic power supply voltage VDDL, which is obtained by stepping down the power supply voltage VDD, to the I/O 160, the logic circuit 180, the OSC 181, the nonvolatile memory (FAMOS) 182, and the like. The second regulator REG2 that is enabled by an enable signal REG2_EN supplies the analog power supply voltage VDDA, which is obtained by stepping down the power supply voltage VDD, to the analog circuit 130.

Figure 6:
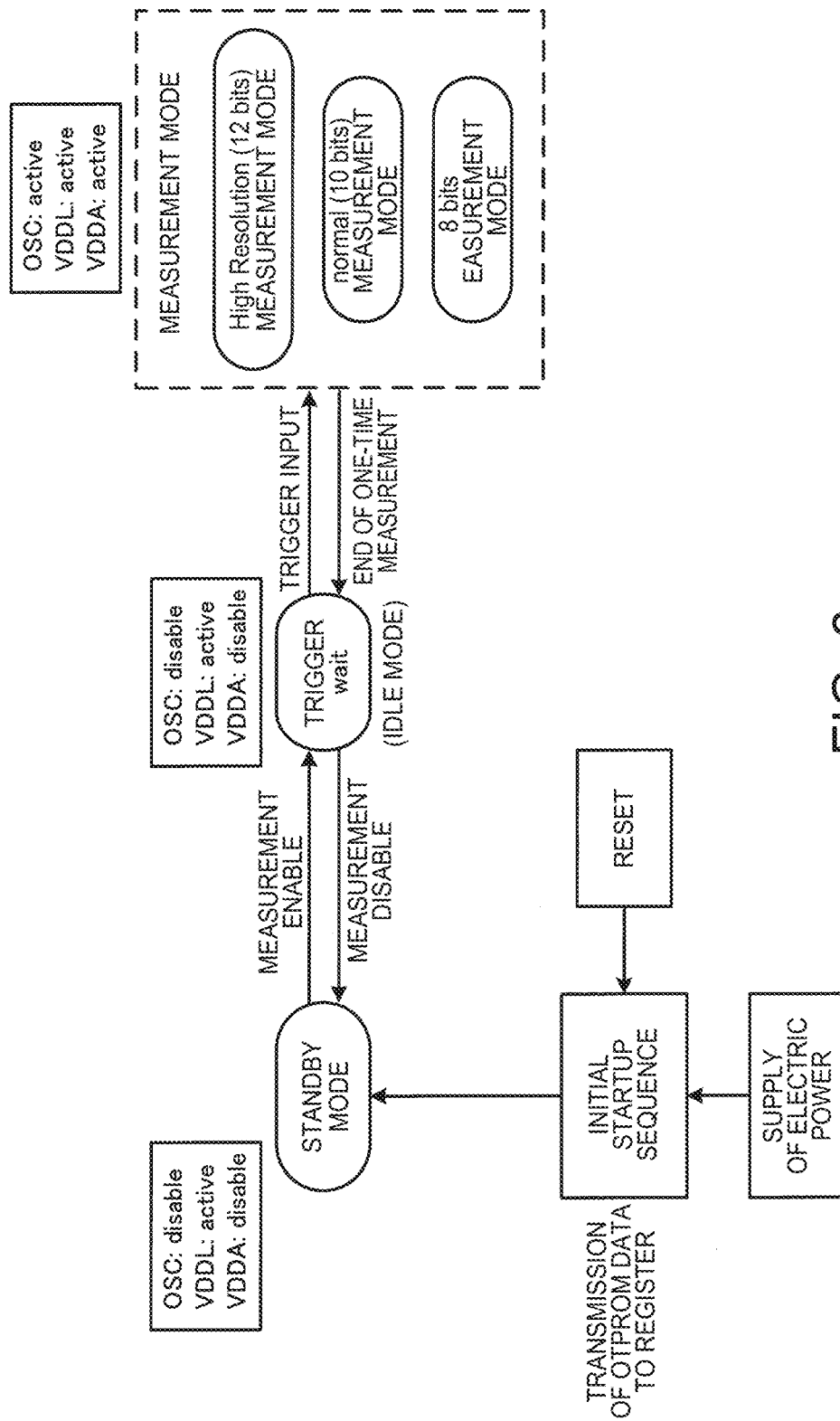
FIG. 6 is a diagram showing a mode transition at the time of intermittent (single) measurement.

Here, a switch SW is provided between the power supply line of the logic power supply voltage VDDL and the power supply line of the analog power supply voltage VDDA. As shown in FIG. 6 to be described later, an idle period (idle mode) is set. In a standby mode or idle mode, the second regulator REG2 is disabled by the enable signal REG2_EN, and the supply of the analog power supply voltage VDDA is cut off. It is possible to reduce power consumption by operating the analog circuit 130 while the analog circuit 130 is detecting acceleration and disabling the analog circuit 130 in the idle period.

In the idle period, the switch SW is turned on by REG2_XTHR that is enabled when REG2_EN is disabled, and the power supply line of the logic power supply voltage VDDL and the power supply line of the analog power supply voltage VDDA are connected to each other. Accordingly, in the standby period or the idle period in which no analog power supply voltage is generated, the logic power supply voltage VDDL is supplied to the analog circuit 130 through the switch SW from the first regulator REG1.

Here, a voltage is also required in order to return the analog circuit 130 in a disable state to an enable state. In this case, it takes time to supply the analog power supply voltage VDDA to the analog circuit 130 by enabling the second regulator REG2. In the present embodiment, in the standby mode or the idle mode, the operation of returning the analog circuit 130 to the enable state based on the enable signal can be performed in a short period of time by supplying the logic power supply voltage VDDL from the first regulator REG1 to the analog circuit 130 through the switch SW.

In the present embodiment, the voltage level of the logic power supply voltage VDDL and the voltage level of the analog power supply voltage VDDA are the same (for example, 1.8 V). However, as long as the analog circuit 130 is operated to return normally, the voltage level of the logic power supply voltage VDDL and the voltage level of the analog power supply voltage VDDA may be different. However, if there is a difference between the voltage level of the logic power supply voltage VDDL and the voltage level of the analog power supply voltage VDDA, a voltage drop or ringing tends to occur at the time of return operation. For this reason, it is preferable that the voltage level of the logic power supply voltage VDDL and the voltage level of the analog power supply voltage VDDA are substantially the same.

5. Intermittent (Single) Measurement Mode Using External Trigger

Figure 5:
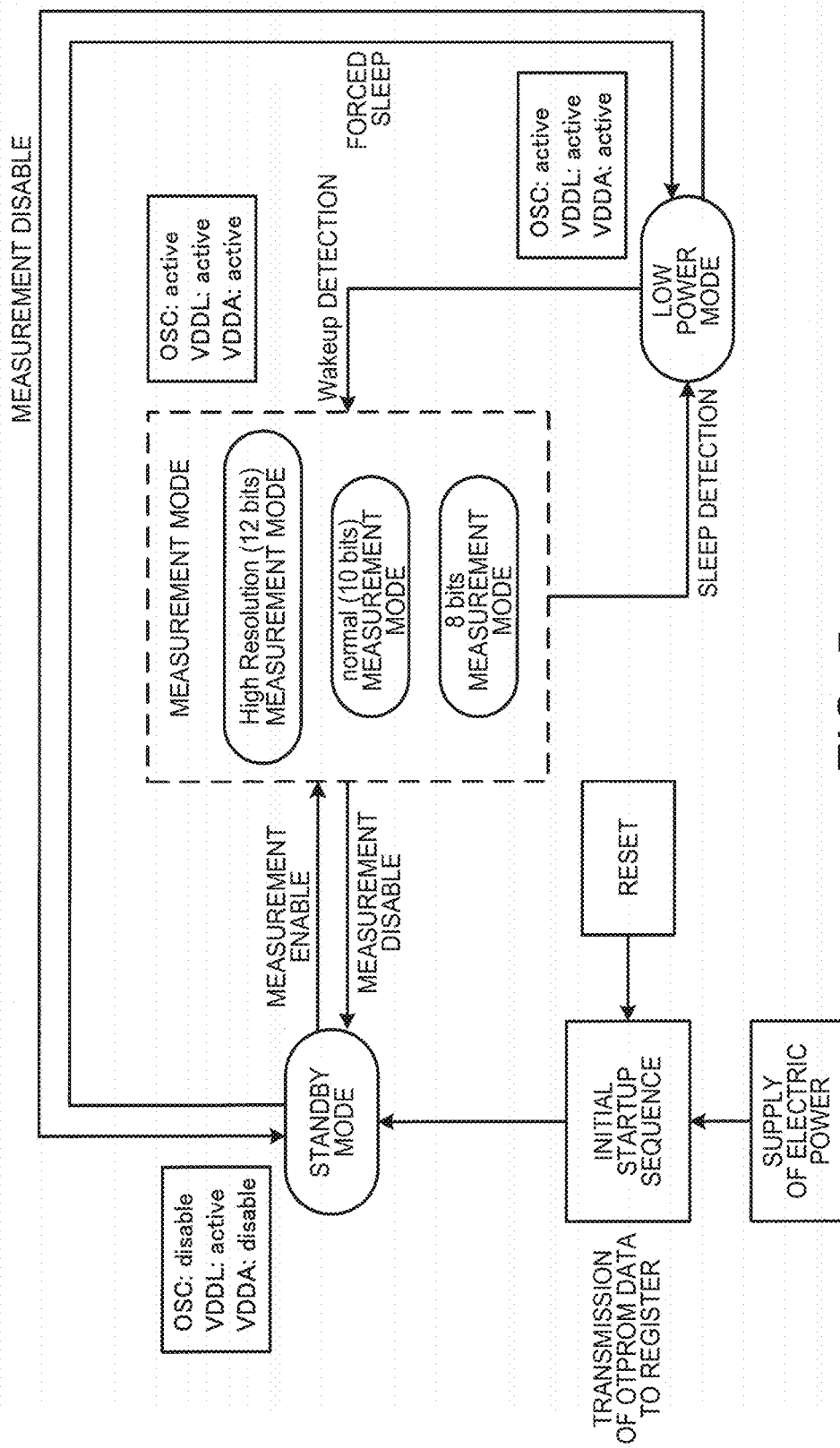
FIG. 5 is a diagram showing a mode transition at the time of continuous measurement.

In the present embodiment, it is possible to set either a continuous measurement mode using an internal trigger or an intermittent (single) measurement mode using an external trigger. FIG. 5 is a diagram showing the mode transition at the time of continuous measurement, and FIG. 6 is a diagram showing the mode transition at the time of intermittent (single) measurement. A standby mode and a measurement mode are shown in FIG. 5. A low power mode is added in FIG. 5, and the state of trigger waiting is set as an idle mode between the standby mode and the measurement mode in FIG. 6.

The standby mode is a mode that is set after the initial startup sequence is performed by the supply of electric power. When the initial startup sequence has been performed, the register 150 is reset, and control data stored in the one-time programmable ROM is transmitted to the register 150. In the standby mode, the first regulator REG1 is enabled and the second regulator REG2 is disabled. Accordingly, as described above, the switch SW shown in FIG. 4 is turned on, and the logic power supply voltage VDDL is supplied to the analog circuit 130.

As measurement modes, three modes (for example, 12 bits, 10 bits, and 8 bits) having different digital conversion resolutions of the acceleration signal can be selected using a signal. In the measurement modes, both of the first regulator REG1 and the second regulator REG2 are enabled. Accordingly, as described above, the switch SW shown in FIG. 4 is turned off, and the analog power supply voltage VDDA is supplied to the analog circuit 130.

The low power mode shown in FIG. 5 is set by detecting a sleep state that is set when acceleration is not detected, and is continued until the wake-up detection in which the sleep state has been released. In the low power mode, digital conversion resolution is fixed at 8 bits. Accordingly, power consumption in the low power mode is lower than that in a case where 10 bits or 12 bits are selected. It is possible to further reduce power consumption by lowering the output data frequency (for example, a sampling rate set in the SR register shown in FIGS. 7 and 8) in the measurement mode.

At the time of intermittent (single) measurement in FIG. 6, acceleration measurement of the X, Y, and Z axes is performed a predetermined number of times, for example, once in the measurement mode. When the intermittent (single) measurement mode ends, an idle mode is entered so as to wait for the next external trigger. Therefore, the measurement mode is intermittently performed. Similar to the standby mode, in the idle mode (idle period), the first regulator REG1 is enabled and the second regulator REG2 is disabled. Accordingly, as described above, the switch SW shown in FIG. 4 is turned on, and the logic power supply voltage VDDL is supplied to the analog circuit 130.

Figure 7:
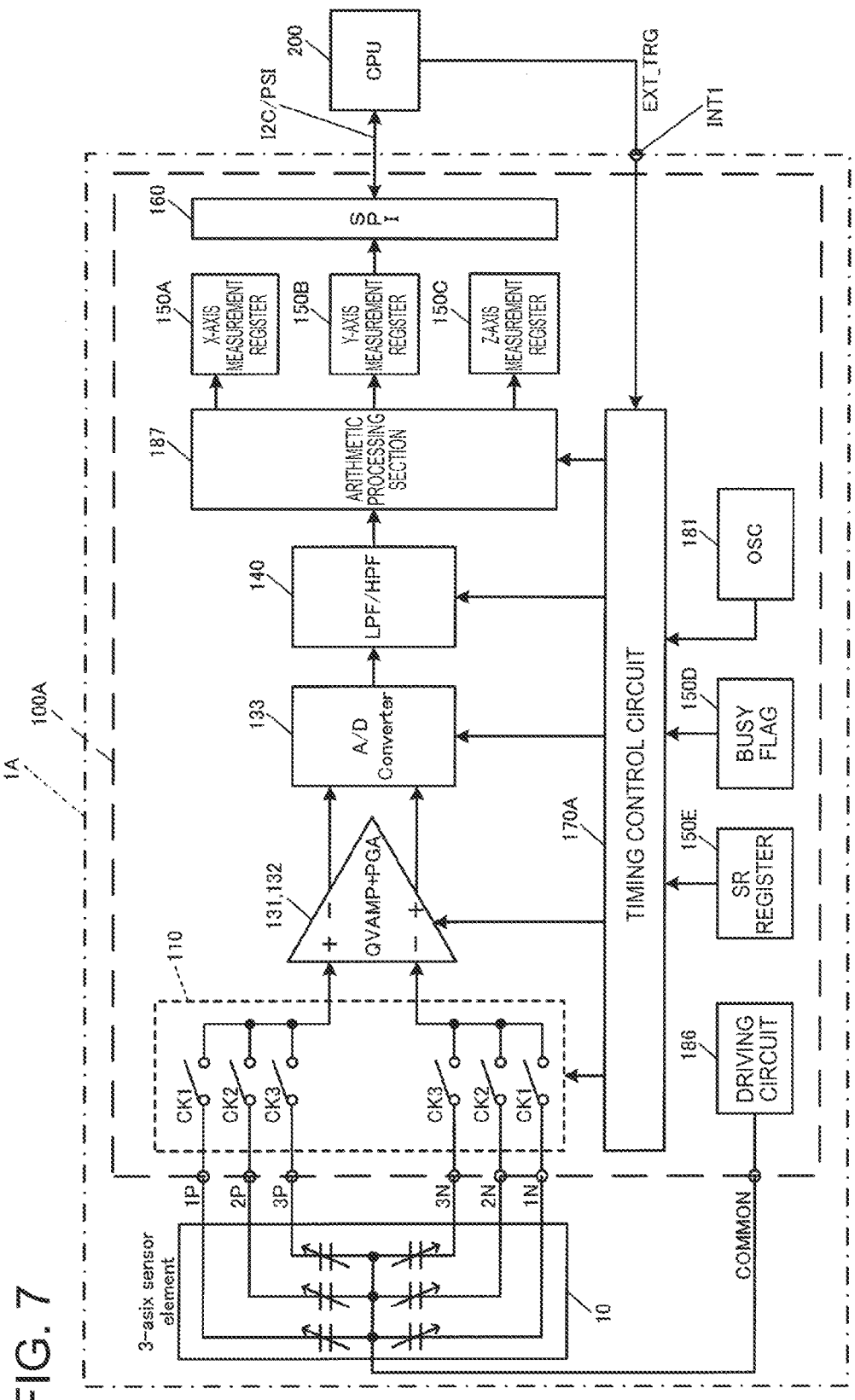
FIG. 7 is a block diagram showing an example in which an external trigger is input to an IC as a hardware trigger.
Figure 8:
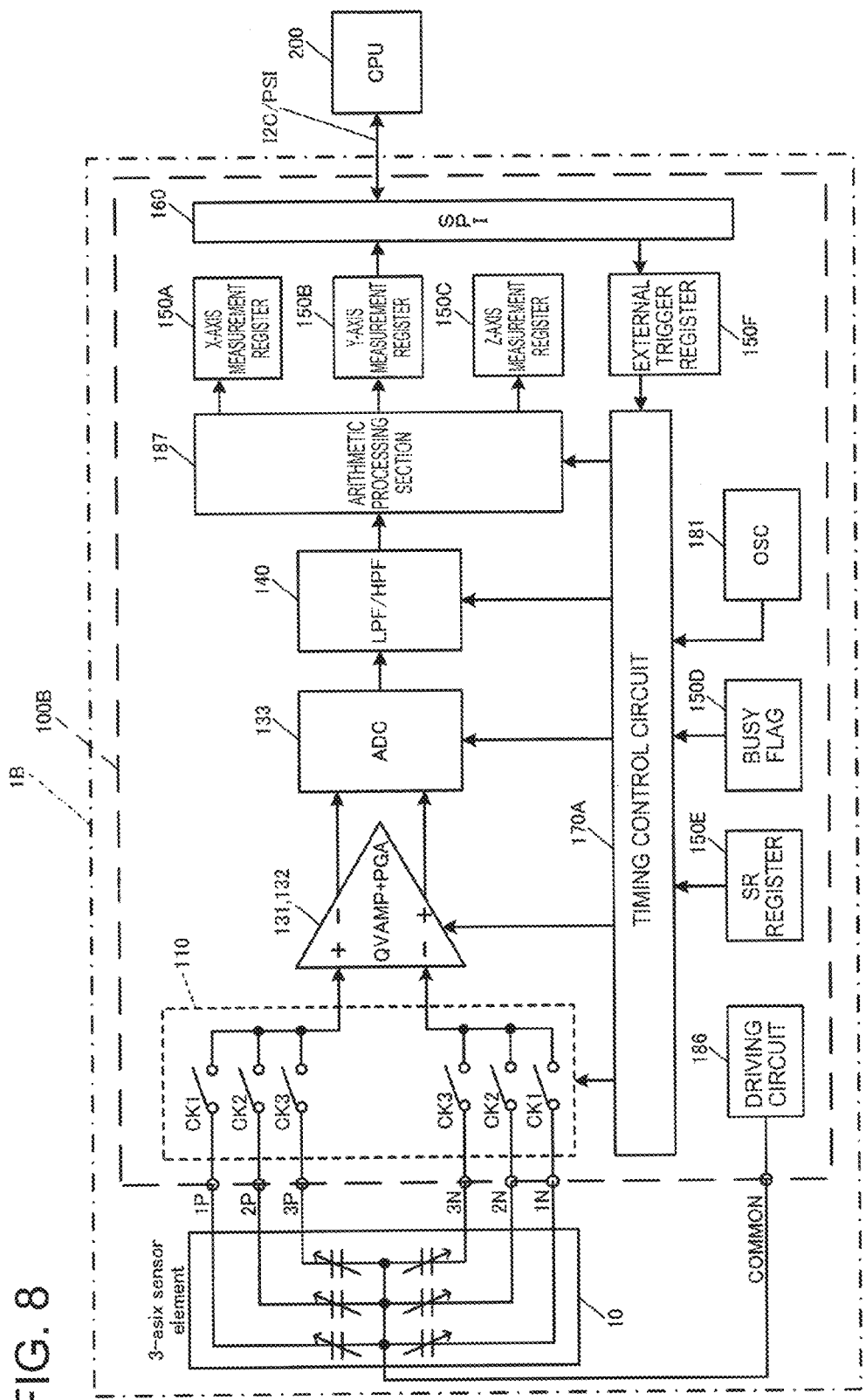
FIG. 8 is a block diagram showing an example in which an external trigger is input to an IC as a software trigger.

FIGS. 7 and 8 show two methods for setting the intermittent (single) measurement mode. In FIGS. 7 and 8, a timing control circuit 170A provided in the control circuit 170 shown in FIG. 3 is shown. In addition, in FIGS. 7 and 8, the register 150 shown in FIG. 3 is shown as functional registers 150A to 150F. That is, the register 150 shown in FIG. 3 includes an X-axis measurement register 150A, a Y-axis measurement register 150B, a Z-axis measurement register 150C, a busy flag register 150D, a sampling rate (SR) setting register 150E, and an external trigger register 150F that are shown in FIG. 7 or 8. In FIGS. 7 and 8, an arithmetic processing section 187 is added between the digital filter 140 and the register 150 that are shown in FIG. 4.

FIG. 7 shows a hardware trigger method, and FIG. 8 shows a software trigger method. As an end to set the hardware trigger, an external terminal of an IC 100A, for example, the interruption terminal INT1 is used. A CPU 200 to which an acceleration sensor 1A shown in FIG. 7 is connected outputs an external trigger from, for example, a timer to the interruption terminal INT1. In FIG. 8, an external trigger transmitted from the CPU 200 according to a predetermined communication protocol is input to the serial parallel interface 160 of an IC 100B, and is stored in the external trigger register 150F.

The control circuit 170 may select the hardware trigger method shown in FIG. 7 and the software trigger method shown in FIG. 8 by signal setting. The hardware trigger method shown in FIG. 7 is advantageous in that the load of the CPU 200 is small. The software trigger method shown in FIG. 8 is advantageous in that the chance of using the interruption terminal ITN1 for other applications is not reduced.

Figure 9:
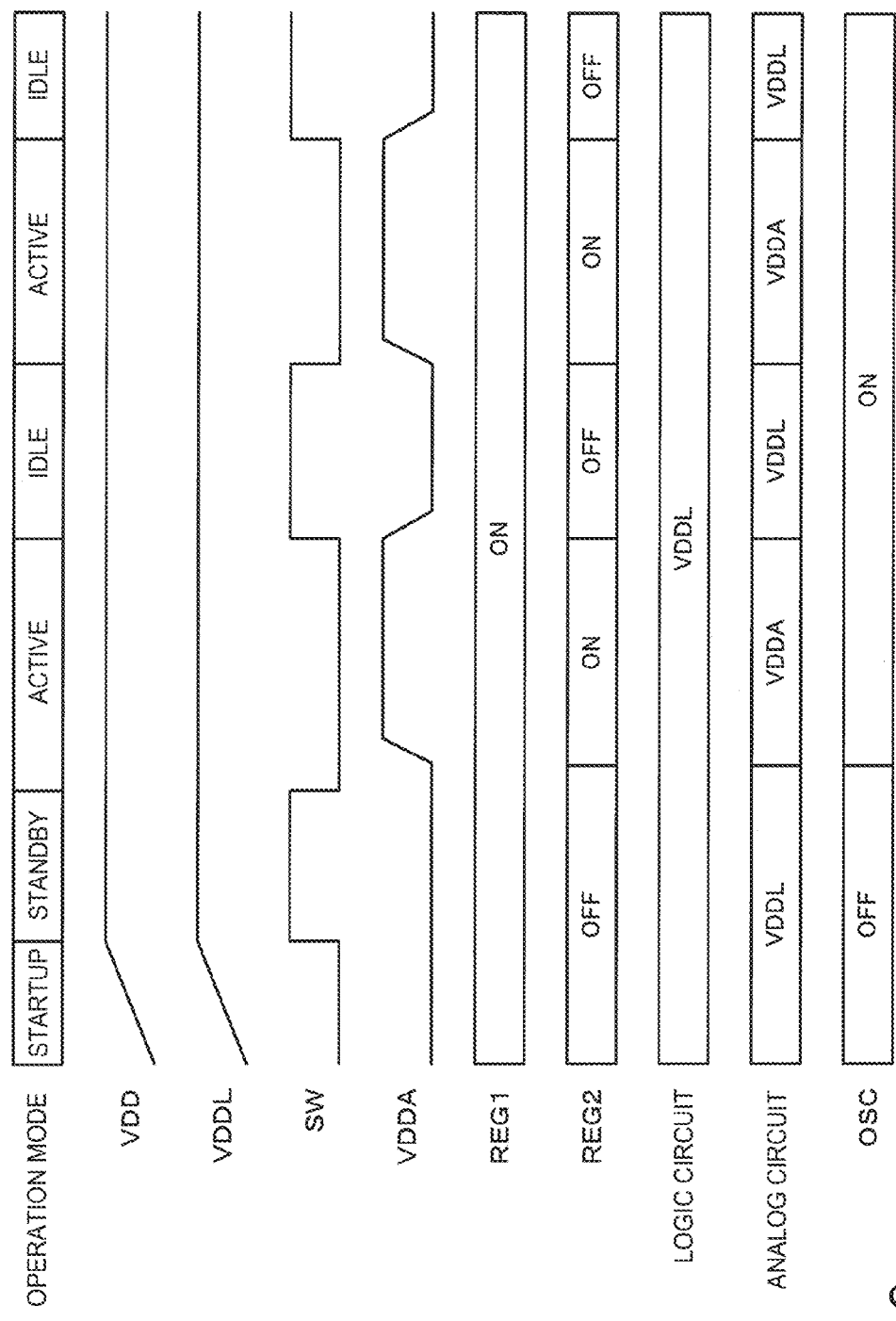
FIG. 9 is a timing chart showing the operation of an acceleration sensor.

The control circuit 170 recognizes the continuous measurement mode shown in FIG. 5 or the intermittent (single) measurement mode shown in FIG. 6 based on a flag or the like. FIG. 9 is a timing chart of each portion set by the control of the control circuit 170 in the intermittent (single) measurement mode. The first regulator REG1 is enabled simultaneously with the startup to generate the logic power supply voltage VDDL, but the second regulator REG2 generates the analog power supply voltage VDDA only when the operation mode (measurement mode) is "active". When the operation mode (measurement mode) is a standby mode or an idle mode that is not "active", the switch SW is turned on and the logic power supply voltage VDDL is supplied to the analog circuit 130.

Figure 10:
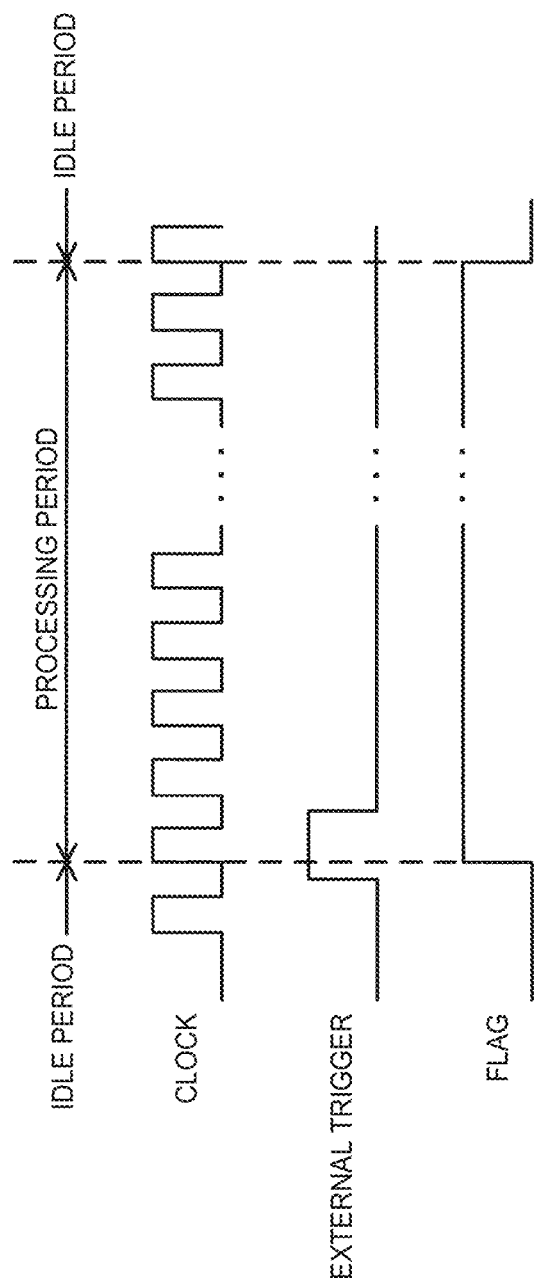
FIG. 10 is a timing chart for explaining the prohibition of dual input of an external trigger.

The SR register shown in FIGS. 7 and 8 sets the sampling rate for setting the digital resolution. In the busy flag register 150D shown in FIGS. 7 and 8, for example, a flag that becomes active during the idle period is set by the timing control circuit 170A. As shown in FIG. 10, the idle period starts at the rising edge of the clock when the external trigger is active. The idle period is ended by counting up a predetermined number of clocks (for example, 156 clocks). The busy flag is active during the idle period. The external trigger that is input in a period in which the busy flag is active is neglected by the timing control circuit 170A. Therefore, it is possible to prevent the same mode from being restarted in the middle of the intermittent (single) measurement mode.

6. Enabling/Disabling of an Analog Circuit

Figure 11:
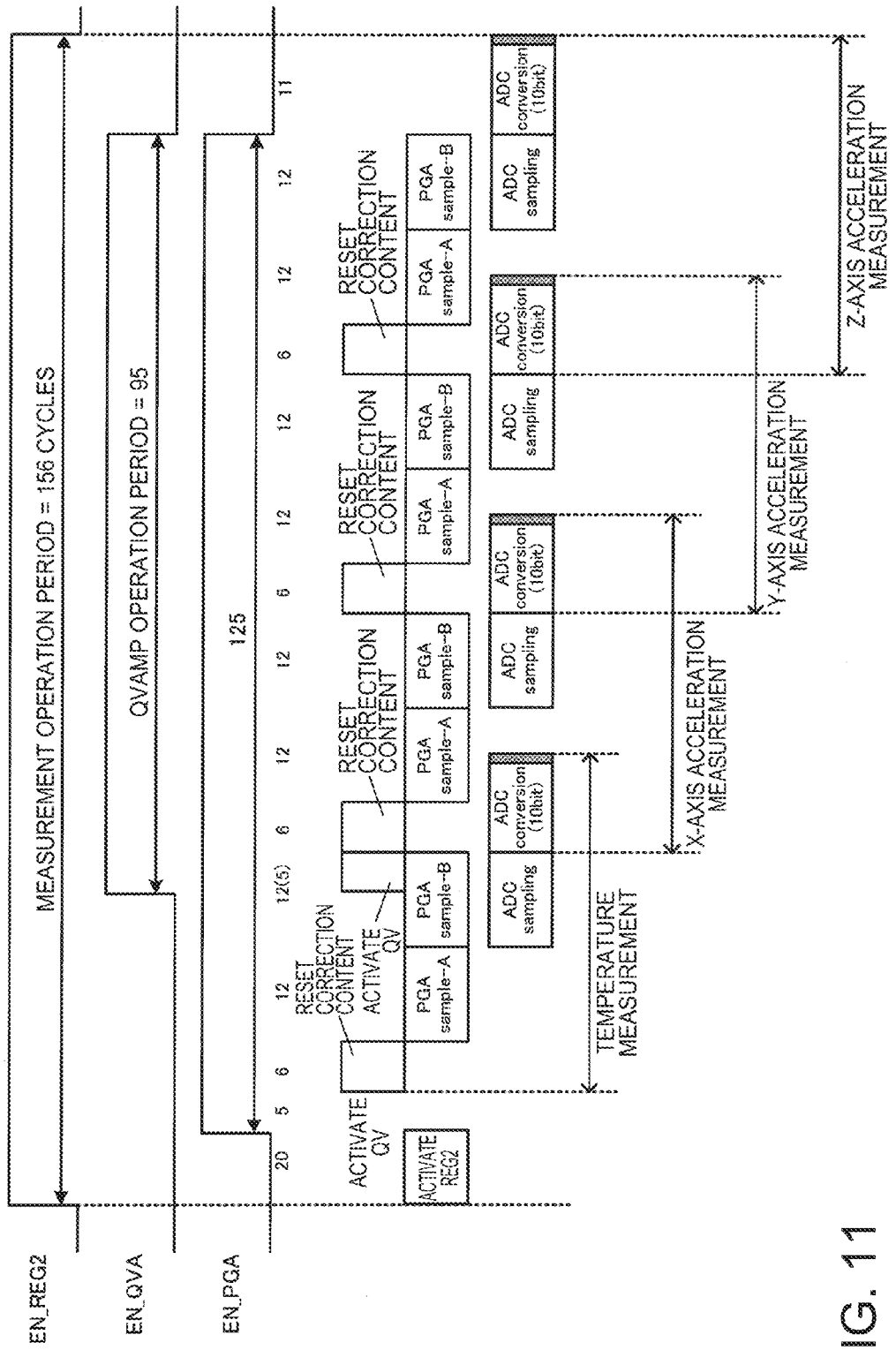
FIG. 11 is a diagram showing the measurement sequence in a single measurement mode.

FIG. 11 is a timing chart in the intermittent (single) measurement mode. The intermittent (single) measurement mode is started by the external trigger described above. In the single measurement mode, the measurement operation period is 156 cycles of a clock, for example. When the single measurement mode has been set, the second regulator REG2 is activated. Then, the QV circuit 131 may be enabled when necessary. The offset adjustment capacitor 120 is reset.

In the single measurement mode, as shown in FIG. 11, temperature measurement, X-axis acceleration measurement, Y-axis acceleration measurement, and Z-axis acceleration measurement are sequentially performed. In each of the four measurement periods, the PGA 132 and the ADC 133 are enabled only in a period necessary for measurement. In the example shown in FIG. 11, the ADC 133 performs conversion into a digital signal having a resolution of 10 bits. The measurement period is shortened if the resolution is low, and is increased if the resolution is high. The PGA 132 and the ADC 133 are disabled once after detecting different physical quantities, such as temperature, X-axis acceleration, Y-axis acceleration, and Z-axis acceleration. Thus, power consumption is reduced.

In addition, the enable period of the PGA 132 is divided into a sample A period and a sample B period. Similarly, the operation period of the ADC 133 is divided into a sampling period and a comparison period. The sample B period of the PGA 132 can be set so as to overlap the sampling period of the ADC 133 on the time axis. The comparison period of the ADC 133 can be set so as to overlap the sample A period of the PGA 132 on the time axis. Therefore, it is possible to shorten each period of temperature measurement, X-axis acceleration measurement, Y-axis acceleration measurement, and Z-axis acceleration measurement. As a result, it is possible to shorten the total single measurement period.

Before the X-axis acceleration measurement, the QV amplifier 131 is enabled to be activated. The enable state of the QV amplifier 131 is maintained for a period of, for example, 95 cycles of the clock, as shown in FIG. 11. After the activation of the QV amplifier 131, the offset adjustment capacitor 120 is reset to have an offset adjustment capacitance value for each axis before the X-axis acceleration measurement, Y-axis acceleration measurement, and Z-axis acceleration measurement are started. The reset period of the offset adjustment capacitor 120 is set using the disable period of the PGA 132.

7. First Regulator REG1

Figure 12:
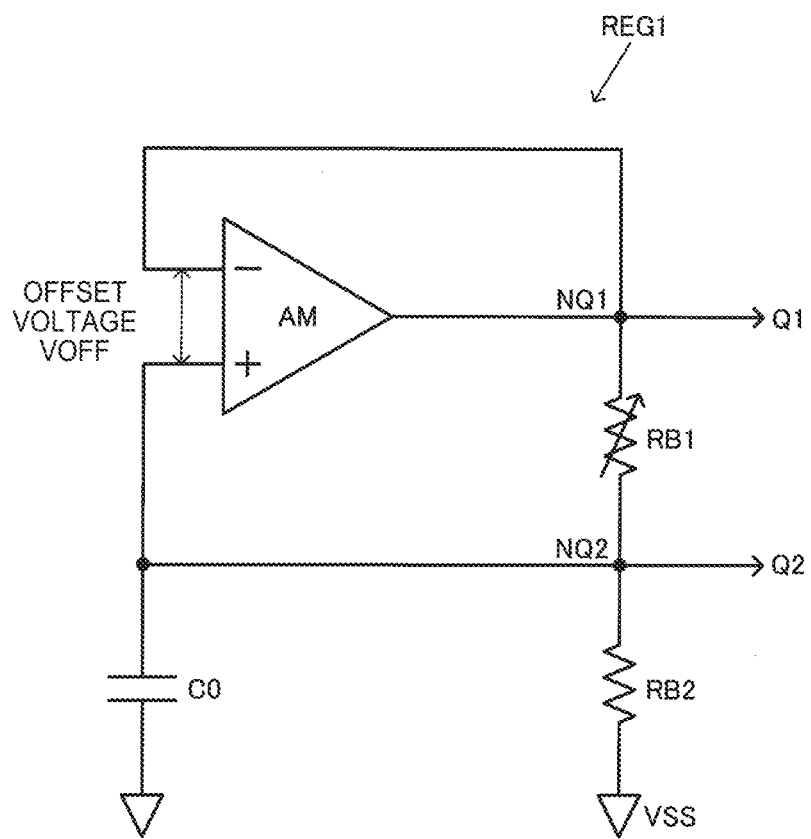
FIG. 12 is a circuit diagram of a first regulator.

FIG. 12 shows an example of the first regulator REG1. The first regulator REG1 includes a differential amplifier circuit AM having an offset voltage VOFF due to a work function difference voltage between the non-inverting input terminal and the inverting input terminal, a first resistor RB1 and a second resistor RB2 provided in series between an output node NQ1 of the amplifier circuit AM and a first power supply node VSS, and a phase compensation capacitor C0 having an end connected to a connection node NQ2 between the first resistor RB1 and the second resistor RB2. The signal of the connection node NQ2 between the first and second resistors RB1 and RB2 is fed back to the non-inverting input terminal of the amplifier circuit AM, and the signal of the output node NQ1 of the amplifier circuit AM is fed back to the inverting input terminal of the amplifier circuit AM.

According to the first regulator REG1, a constant voltage determined by the offset voltage between the non-inverting input terminal and the inverting input terminal of the amplifier circuit AM and the resistance ratio between the first and second resistors RB1 and RB2 is generated. The phase compensation capacitor C0 is provided at the connection node between the first and second resistors RB1 and RB2, and the signal of this connection node is fed back to the non-inverting input terminal of the amplifier circuit AM and the signal of the output node of the amplifier circuit AM is fed back to the inverting input terminal of the amplifier circuit AM. Thus, it is possible to construct the first regulator REG1 capable of generating a constant voltage with a stable circuit operation.

The first resistor RB1 shown in FIG. 12 can be a variable resistor. In the process for testing the acceleration sensor element 10 and the IC 100, a high voltage (test voltage) of, for example, about 3 V is applied to a 1.8 V system. The output voltage level of the first regulator REG1 can be changed to a high voltage level by changing the resistance value of the first resistor RB1 through register setting change.

Figure 13:
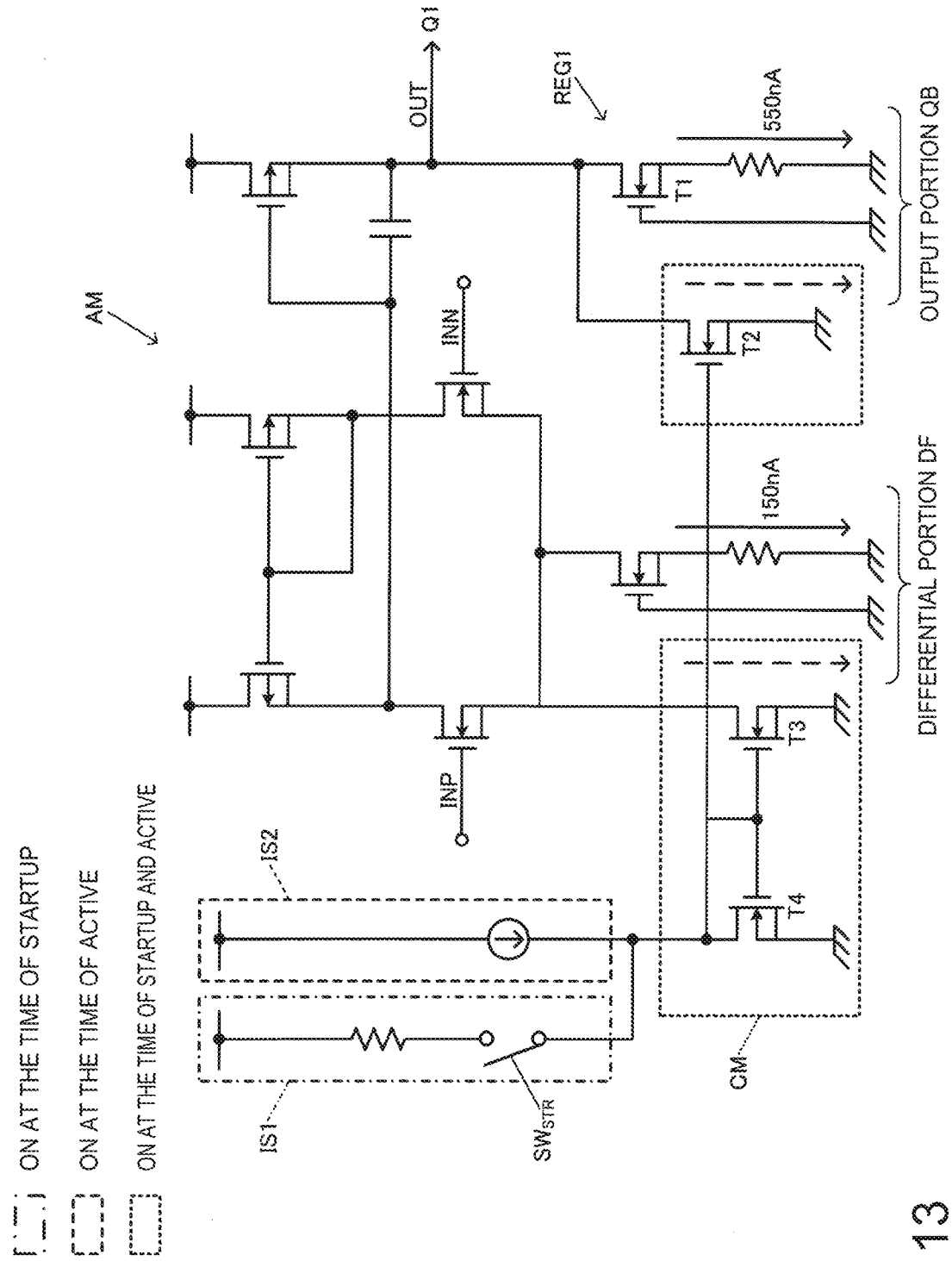
FIG. 13 is a circuit diagram of the first regulator shown in FIG. 12 that has been improved.

In the first regulator REG1 shown in FIG. 13, an element or a circuit is additionally provided in a location surrounded by the broken line of the amplifier circuit AM shown in FIG. 12. Thus, by increasing the operating current IOP flowing through the amplifier circuit AM at the time of startup and "active", the capability is increased. As shown in FIG. 13, a transistor T2 is added in parallel with an output transistor T1 provided on the ground terminal side of an output portion QB of the amplifier circuit AM. A transistor T3 added to a differential portion DF of the amplifier circuit AM and a transistor T4, to which the same gate voltage as in the transistor T3 is applied, form a current mirror circuit CM. As a current source of the current mirror circuit CM, a first current source IS1 operating at the time of startup and the second current source IS2 operating at the time of "active" are added. In the first current source IS1 operating at the time of startup, a start switch STSTR is turned on by the startup, and a current flows through the current mirror circuit CM.

In the standby mode, no current flows through the current mirror CM. Accordingly, since the amplifier circuit AM operates in a weak inversion region, for example, a current of 150 nA flows through the differential portion DF and a current of 550 nA flows through the output portion QB. Eventually, a current of 700 nA flows as the operating current IOP. When the start switch STSTR is turned on at the time of startup, a current of 20 μA flows through the added transistors T2 and T3, as indicated by the arrow of the broken line, due to the operation of the current mirror circuit CM. Therefore, it is possible to increase the operating current IOP to 50 μA. In addition, the start switch STSTR is turned off using a power-on reset signal when a predetermined time has passed from the startup. At the time of "active" when the second regulator RGE2 is enabled, the second current source IS2 is turned on instead of the first current source IS1. Accordingly, it is possible to increase the operating current IOP up to 30 μA, for example. In this manner, it is possible to increase the capability of the first regulator REG1 at the time of startup and "active" (overload).

8. Second Regulator REG2

Figure 14:
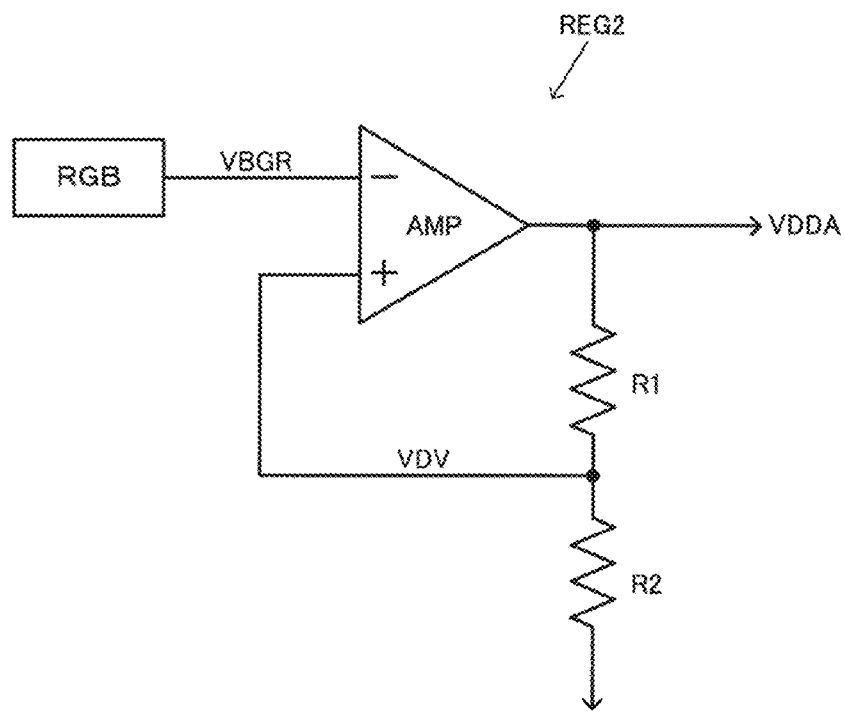
FIG. 14 is a circuit diagram of a second regulator.

FIG. 14 shows the second regulator RGE2 using a band gap reference circuit. In FIG. 14, a band gap reference voltage VBGR (for example, 1.21 V) generated by a band gap reference circuit BGR is input to the negative terminal of an amplifier AMP of the second regulator REG2. A voltage VDV obtained by dividing an output voltage VDDA of the amplifier AMP with a voltage divider circuit formed by voltage dividing resistors R1 and R2 is input to the positive terminal of the amplifier AMP. The amplifier AMP performs negative feedback control so that the voltage VDV of the voltage divider circuit formed by the voltage divider circuits R1 and R2 and the electric potential of the band gap reference voltage VBGR match each other with the band gap reference voltage VBGR as a reference voltage. By amplifying the band gap reference voltage VBGR as described above, it is possible to generate the analog power supply voltage VDDA of 1.8 V, for example.

9. Electronic Apparatus and Moving Object

Figure 15:
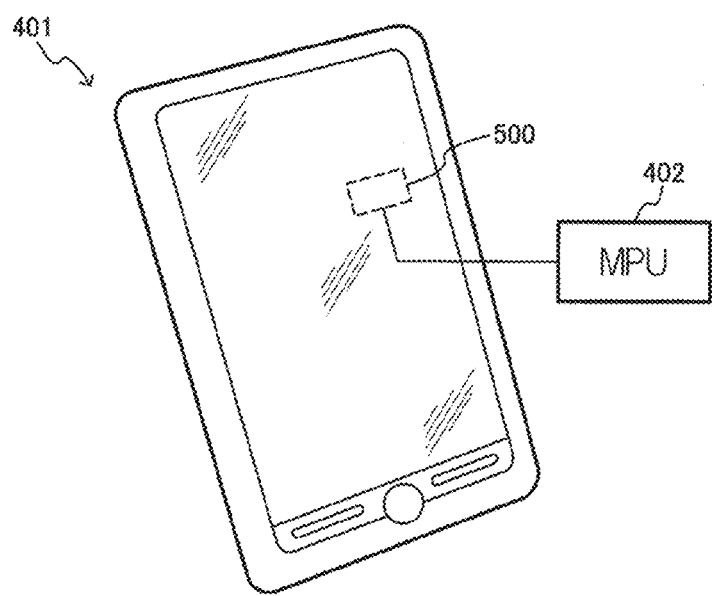
FIG. 15 is a conceptual diagram schematically showing the configuration of a smartphone as a specific example of an electronic device.

FIG. 15 schematically shows a smartphone 401 as a specific example of an electronic apparatus. A physical quantity detecting device 500 including not only the three-axis acceleration sensor 1 shown in FIG. 3 but also a three-axis gyro sensor and a detection circuit connected thereto is built into the smartphone 401. The physical quantity detecting device 500 can detect the posture of the smartphone 401. So-called motion sensing is performed. The detection signal of the physical quantity detecting device 500 can be supplied to a microcomputer chip (MPU) 402, for example. The MPU 402 can perform various kinds of processing according to the motion sensing. In addition, such motion sensing can be used in electronic apparatuses, such as a mobile phone, a portable game machine, a game controller, a car navigation system, a pointing device, a head mounting display, and a tablet PC. The physical quantity detecting device 500 can be built in in order to realize the motion sensing.

Figure 16:
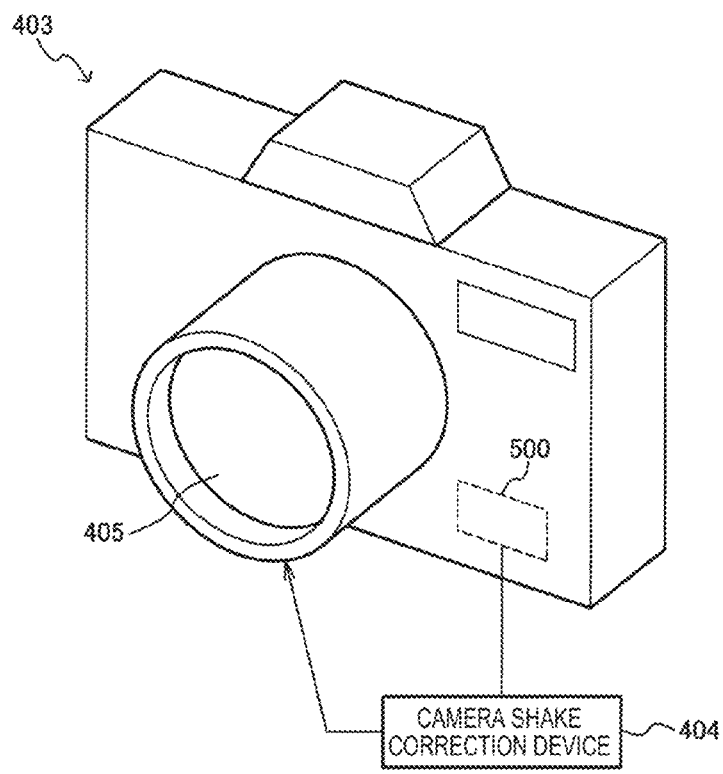
FIG. 16 is a conceptual diagram schematically showing the configuration of a digital still camera as another specific example of an electronic device.

FIG. 16 schematically shows a digital still camera (hereinafter, referred to as a "camera") 403 as another specific example of an electronic apparatus. The physical quantity detecting device 500 is built into the camera 403. The physical quantity detecting device 500 can detect the posture of the camera 403. The detection signal of the physical quantity detecting device 500 can be supplied to a camera shake correction device 404. The camera shake correction device 404 can move a specific lens, for example, in a lens set 405 according to the detection signal of the physical quantity detecting device 500. Thus, camera shake can be corrected. In addition, camera shake correction can be used in a digital video camera. The physical quantity detecting device 500 can be built in in order to realize the camera shake correction.

Figure 17:
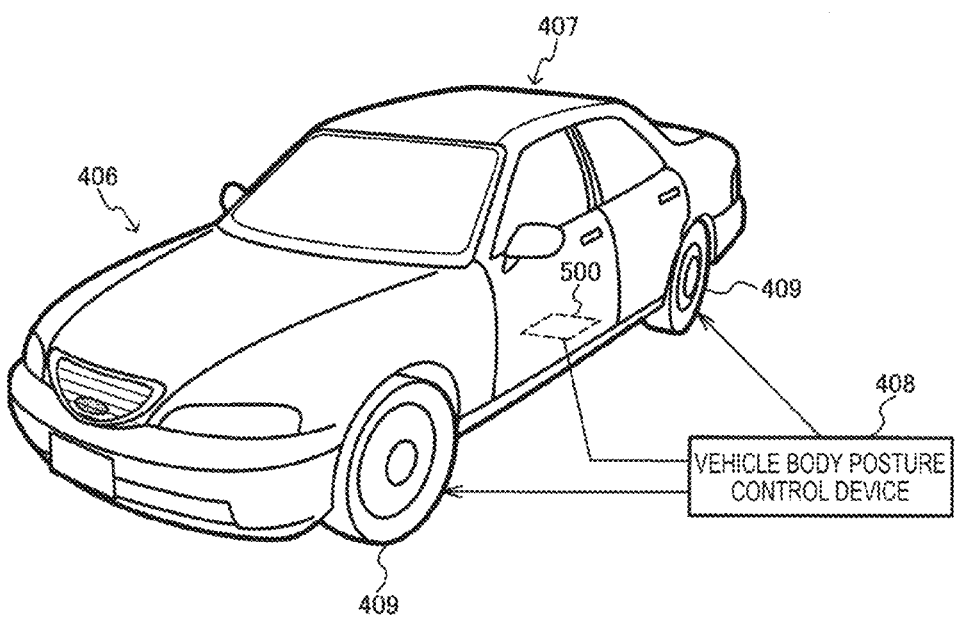
FIG. 17 is a conceptual diagram schematically showing the configuration of a vehicle as a specific example of a moving object.

FIG. 17 schematically shows a vehicle 406 as a specific example of a moving object. The physical quantity detecting device 500 is built into the vehicle 406. The physical quantity detecting device 500 can detect the posture of the vehicle body 407. The detection signal of the physical quantity detecting device 500 can be supplied to a vehicle body posture control device 408. The vehicle body posture control device 408 can control the hardness of the suspension according to the posture of the vehicle body 407 or can control the braking of each wheel 409, for example. In addition, such posture control can be used in various moving objects, such as a bipedal walking robot, an aircraft, and a helicopter. The physical quantity detecting device 500 can be built in in order to realize the posture control.

While the present embodiment has been described in detail, it will be apparent to those skilled in the art that various changes and modifications can be made without departing from the novel teachings and advantages of the invention. Accordingly, all of such modification examples still are included in the range of the invention. For example, in the specification or diagrams, a term which is described at least once together with different terms having a broader meaning or the same meaning can be replaced with the different terms in any part of the specification or diagrams. The configuration and operation of the analog circuit 130, the logic circuit 180, the first regulator REG1, the second regulator REG2, and the like are not limited to those described in the present embodiment, and various modifications can be made thereto. In addition, the electronic circuit or the IC (physical quantity detection circuit) to which the invention is applied can also be applied to the analog output when the ADC 133 is not provided without being limited to the digital output. The physical quantity detecting sensor is not limited to the acceleration sensor, and application to various sensors for detecting the physical quantity, such as an angular velocity sensor and a pressure sensor, is also possible.

The entire disclosure of Japanese Patent Application No. 2014-062506, filed Mar. 25, 2014 is expressly incorporated by reference herein.

What is claimed is:

1. A physical quantity detecting sensor, comprising:
a physical quantity detecting sensor element; and
an integrated circuit connected to the physical quantity detecting sensor element,
wherein the integrated circuit includes:
a logic circuit;
an analog circuit;
a first regulator that supplies a logic power supply voltage generated based on a power supply voltage to the logic circuit;
a second regulator that is switched to enable or disable and supplies an analog power supply voltage, which is generated based on the power supply voltage when the second regulator is set to enable, to the analog circuit; and
a switch for supplying the logic power supply voltage to the analog circuit when the second regulator is set to disable,
wherein the physical quantity detecting sensor element is a capacitive sensor element,
the analog circuit includes a charge-voltage conversion circuit that converts an electric charge from the capacitive sensor element into a voltage, and
the charge-voltage conversion circuit is set to disable when the second regulator is set to disable.

2. The physical quantity detecting sensor according to claim 1,
wherein the switch is switched to ON or OFF through a signal for setting the second regulator to disable.

3. The physical quantity detecting sensor according to claim 1,
wherein a voltage level of the logic power supply voltage and a voltage level of the analog power supply voltage are substantially the same.

4. The physical quantity detecting sensor according to claim 1,
wherein, when testing the integrated circuit, the first regulator generates a test voltage higher than the logic power supply voltage, and supplies the test voltage to the analog circuit through the switch.

5. The physical quantity detecting sensor according to claim 1,
wherein the analog circuit further includes a programmable gain amplifier that amplifies an output signal from the charge-voltage conversion circuit with a set gain, and
the programmable gain amplifier is set to disable when the second regulator is set to disable.

6. The physical quantity detecting sensor according to claim 5,
wherein the analog circuit further includes an analog-to-digital converter that performs analog-to-digital conversion of an output signal from the programmable gain amplifier, and
the analog-to-digital converter is set to disable when the second regulator is set to disable.

7. The physical quantity detecting sensor according to claim 6,
wherein a processing period in which the analog circuit processes a signal from the physical quantity detecting sensor based on an external trigger is set, the second regulator is set to enable within the processing period, and the analog circuit is set to disable in a period other than the processing period, and
at least one of the programmable gain amplifier and the analog-to-digital converter is set to disable in an idle period set within the processing period.

8. A physical quantity detecting sensor comprising:
a physical quantity detecting sensor element; and
an integrated circuit connected to the physical quantity detecting sensor element,
wherein the integrated circuit includes:
a logic circuit;
an analog circuit;
a first regulator that supplies a logic power supply voltage generated based on a power supply voltage to the logic circuit;
a second regulator that is switched to enable or disable and supplies an analog power supply voltage, which is generated based on the power supply voltage when the second regulator is set to enable, to the analog circuit; and
a switch for supplying the logic power supply voltage to the analog circuit when the second regulator is set to disable,
wherein the first regulator includes a differential amplifier circuit having an offset voltage due to a work function difference voltage between a non-inverting input terminal and an inverting input terminal, first and second resistors provided in series between an output node of the amplifier circuit and a first power supply node, and a phase compensation capacitor having an end connected to a connection node between the first and second resistors, and
a signal of the connection node is fed back to the non-inverting input terminal of the amplifier circuit, and a signal of the output node is fed back to the inverting input terminal of the amplifier circuit.

9. The physical quantity detecting sensor according to claim 8,
wherein the first regulator further includes a current source, which generates a current when activating the first regulator and at the time of overload when the second regulator is in an enable state, and a current mirror circuit that makes a current equal to the current flowing through the current source flow through the first regulator.

10. The physical quantity detecting sensor according to claim 1,
wherein the second regulator includes a band gap reference circuit, an amplifier that amplifies a band gap reference voltage from the band gap reference circuit, and a voltage divider circuit provided in a negative feedback path of the amplifier, and
the amplifier performs negative feedback control so that a voltage of the voltage divider circuit and an electric potential of the band gap reference voltage match each other with the band gap reference voltage as a reference voltage.

11. An electronic apparatus comprising the physical quantity detecting sensor according to claim 1.

12. A moving object comprising the physical quantity detecting sensor according to claim 1.

13. An electronic circuit, comprising:
a logic circuit;
an analog circuit;
a first regulator that supplies a logic power supply voltage generated based on a power supply voltage to the logic circuit;
a second regulator that is switched to enable or disable and supplies an analog power supply voltage, which is generated based on the power supply voltage when the second regulator is set to enable, to the analog circuit; and
a switch for supplying the logic power supply voltage to the analog circuit when the second regulator is set to disable,
wherein the electronic circuit is connected to a capacitive sensor element,
the analog circuit includes a charge-voltage conversion circuit that converts an electric charge from the capacitive sensor element into a voltage, and
the charge-voltage conversion circuit is set to disable when the second regulator is set to disable.

14. The electronic circuit according to claim 13,
wherein the switch is switched to ON or OFF by a signal for setting the second regulator to disable.

15. The electronic circuit according to claim 13,
wherein a voltage level of the logic power supply voltage and a voltage level of the analog power supply voltage are substantially the same.

16. The electronic circuit according to claim 13,
wherein, when testing the electronic circuit, the first regulator generates a test voltage higher than the logic power supply voltage, and supplies the test voltage to the analog circuit through the switch.

17. The electronic circuit according to claim 13,
wherein the analog circuit further includes a programmable gain amplifier that amplifies an output signal from the charge-voltage conversion circuit with a set gain, and
the programmable gain amplifier is set to disable when the second regulator is set to disable.

18. The electronic circuit according to claim 17,
wherein the analog circuit further includes an analog-to-digital converter that performs analog-to-digital conversion of an output signal from the programmable gain amplifier, and
the analog-to-digital converter is set to disable when the second regulator is set to disable.

* * * * *